United States Patent
Xu et al.

(10) Patent No.: US 10,475,822 B2
(45) Date of Patent: Nov. 12, 2019

(54) ARRAY SUBSTRATE, DISPLAY PANEL AND DISPLAY APPARATUS HAVING THE SAME, AND FABRICATING METHOD THEREOF

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhuo Xu, Beijing (CN); Yajie Bai, Beijing (CN); Xiaolin Wang, Beijing (CN); Rui Wang, Beijing (CN); Fei Shang, Beijing (CN); Haijun Qiu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/578,534

(22) PCT Filed: Nov. 2, 2016

(86) PCT No.: PCT/CN2016/104348
§ 371 (c)(1),
(2) Date: Nov. 30, 2017

(87) PCT Pub. No.: WO2018/081953
PCT Pub. Date: May 11, 2018

(65) Prior Publication Data
US 2018/0331126 A1    Nov. 15, 2018

(51) Int. Cl.
*H01L 27/12*    (2006.01)
*H01L 27/32*    (2006.01)
(Continued)

(52) U.S. Cl.
CPC .......... *H01L 27/124* (2013.01); *H01L 21/707* (2013.01); *H01L 27/127* (2013.01);
(Continued)

(58) Field of Classification Search
CPC . H01L 27/12; H01L 27/1214; H01L 27/1222; H01L 27/1225; H01L 27/124;
(Continued)

(56) References Cited

U.S. PATENT DOCUMENTS

2008/0299702 A1* 12/2008 Son ..................... H01L 29/7869
438/104
2010/0123138 A1    5/2010 Choi et al.
(Continued)

FOREIGN PATENT DOCUMENTS

CN    101236738 A    8/2008
CN    102263111 A    11/2011
(Continued)

OTHER PUBLICATIONS

International Search Report & Written Opinion dated Sep. 22, 2017, regarding PCT/CN2016/104348.
First Office Action in the Korean Patent Application No. 20187001555, dated Feb. 27, 2019; English translation attached.

*Primary Examiner* — Eduardo A Rodela
(74) *Attorney, Agent, or Firm* — Intellectual Valley Law, P.C.

(57) ABSTRACT

The present application discloses an array substrate, a display panel and a display apparatus having the same, and a fabricating method thereof. The array substrate includes a base substrate; a first electrode and a second electrode, the first electrode and the second electrode being two different electrodes selected from a pixel electrode and a common electrode; and a thin film transistor including an active layer, an etch stop layer on a side of the active layer distal to the base substrate, a first node, and a second node.

20 Claims, 7 Drawing Sheets

(51) Int. Cl.
*H01L 21/70* (2006.01)
*H01L 29/786* (2006.01)

(52) U.S. Cl.
CPC ...... *H01L 27/1214* (2013.01); *H01L 27/1222* (2013.01); *H01L 27/1225* (2013.01); *H01L 27/1248* (2013.01); *H01L 27/1262* (2013.01); *H01L 27/1288* (2013.01); *H01L 27/326* (2013.01); *H01L 27/3248* (2013.01); *H01L 27/3262* (2013.01); *H01L 27/3276* (2013.01); *H01L 29/7869* (2013.01); *H01L 29/78633* (2013.01)

(58) Field of Classification Search
CPC ............. H01L 27/1248; H01L 27/1259; H01L 27/3248; H01L 27/3258; H01L 27/326; H01L 27/3262; H01L 27/3276; H01L 27/3288; H01L 27/3297; H01L 31/022475; H01L 31/022483; H01L 21/28; H01L 21/28035; H01L 21/707
See application file for complete search history.

(56) References Cited

U.S. PATENT DOCUMENTS

| | | |
|---|---|---|
| 2011/0291096 A1 | 12/2011 | Ryoo et al. |
| 2013/0077034 A1* | 3/2013 | Jung ............... G02F 1/1345 349/122 |
| 2014/0061634 A1 | 3/2014 | Cao et al. |
| 2014/0167031 A1 | 6/2014 | Choi et al. |
| 2015/0255616 A1* | 9/2015 | Hara ................ G02F 1/1368 257/43 |

FOREIGN PATENT DOCUMENTS

| | | |
|---|---|---|
| CN | 102520534 A | 6/2012 |
| CN | 102651322 A | 8/2012 |
| CN | 102790012 A | 11/2012 |
| CN | 103021959 A | 4/2013 |
| CN | 103985713 A | 8/2014 |
| CN | 104898341 A | 9/2015 |
| KR | 20110130896 A | 12/2011 |

* cited by examiner

ARRAY SUBSTRATE, DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/104348, filed Nov. 2, 2016, the contents of which are incorporated by reference in the entirety.

TECHNICAL FIELD

The present invention relates to display technology, more particularly, to an array substrate, a display panel and a display apparatus having the same, and a fabricating method thereof.

BACKGROUND

As compared to conventional amorphous silicon thin film transistors, metal oxide or metal oxynitride thin film transistors have many unique advantages such as a higher carrier density and a higher mobility rate. Accordingly, the metal oxide or metal oxynitride thin film transistors can be made smaller, and the display panel made of such thin film transistors can achieve a higher resolution and a better display effect. The metal oxide or metal oxynitride thin film transistors have found a wide range of applications in display field. The metal oxide or metal oxynitride thin film transistors, however, typically require an etch stop layer on the active layer, otherwise degraded transistor reliability will occur. Fabrication of the etch stop layer requires an additional patterning process using an additional mask plate, increasing manufacturing costs. Attempts to reduce the number of patterning processes, for example, using a half-tone mask plate, often lead to further complications not easily controllable, affecting product quality.

SUMMARY

In one aspect, the present invention provides an array substrate comprising a base substrate; a first electrode and a second electrode, the first electrode and the second electrode being two different electrodes selected from a pixel electrode and a common electrode; and a thin film transistor comprising an active layer, an etch stop layer on a side of the active layer distal to the base substrate, a first node, and a second node; wherein the active layer comprises a channel region, a first node contact region, and a second node contact region; a projection of the channel region on the base substrate substantially overlaps with that of the etch stop layer; a projection of the first node contact region and the second node contact region on the base substrate are outside that of the etch stop layer; the first node is on a side of the first node contact region distal to the base substrate; and the second node is on a side of the second node contact region distal to the base substrate; and the active layer and the first electrode are in a same layer, and are made of a semiconductor material comprising $M1O_aN_b$, wherein M1 is a single metal or a combination of metals, a>0, and b≥0.

Optionally, the array substrate further comprises an auxiliary etch stop layer on a side of the first electrode distal to the base substrate: the auxiliary etch stop layer and the etch stop layer are in a same layer and are made of a same material.

Optionally, the array substrate further comprises a data line; wherein the data line comprises a first sub-layer and a second sub-layer; the first sub-layer on a side of the second sub-layer proximal to the base substrate; the first sub-layer is in a same layer as the active layer and the first electrode, and is made of a same material as that of the active layer and the first electrode; and the second sub-layer is in a same layer as the first node and the second node, and is made of a same material as that of the first node and the second node.

Optionally, the second electrode is on a side of the first electrode distal to the base substrate.

Optionally, the second electrode is on a side of the first electrode proximal to the base substrate.

Optionally, the first electrode is the pixel electrode and the second electrode is the common electrode.

Optionally, the array substrate further comprises a gate electrode on the base substrate; a common electrode signal line in a same layer and made of a same material as the gate electrode; a gate insulating layer on a side of the gate electrode and the common electrode signal line distal to the base substrate; a passivation layer on a side of the gate insulating layer distal to the common electrode signal line; and a via extending through the gate insulating layer and the passivation layer; wherein the common electrode is on a side of the passivation layer distal to the gate insulating layer, and is electrically connected to the common electrode signal line through the via.

Optionally, the array substrate further comprises a gate electrode on the base substrate; a common electrode signal line in a same layer as the gate electrode; and a gate insulating layer between the gate electrode and the active layer; wherein the common electrode is on a side of the gate insulating layer proximal to the base substrate, and is electrically connected to the common electrode signal line.

Optionally, the first electrode is the common electrode and the second electrode is the pixel electrode.

Optionally, the array substrate further comprises a gate electrode on the base substrate; a gate insulating layer between the gate electrode and the active layer; and a via extending through the gate insulating layer; wherein the pixel electrode is on a side of the gate insulating layer proximal to the base substrate, and is electrically connected to the second node through the via.

Optionally, the $M1O_aN_b$ is one of indium gallium zinc oxide, indium zinc hafnium, indium zinc zirconium oxide, indium zinc tin oxide, indium zinc oxide, aluminum indium zinc oxide, zinc oxide, and aluminum indium zinc oxide.

In another aspect, the present invention provides a method of fabricating an array substrate comprising forming a first electrode and a second electrode on a base substrate, the first electrode and the second electrode being two different electrodes selected from a pixel electrode and a common electrode; and forming a thin film transistor comprising an active layer, an etch stop layer on a side of the active layer distal to the base substrate, a first node, and a second node; wherein the active layer is formed to have a channel region, a first node contact region, and a second node contact region; a projection of the channel region on the base substrate substantially overlaps with that of the etch stop layer; a projection of the first node contact region and the second node contact region on the base substrate are outside that of the etch stop layer; the first node is formed on a side of the first node contact region distal to the base substrate; and the second node is formed on a side of the second node contact region distal to the base substrate; and the active layer and the first electrode are formed in a same layer, and are formed using a semiconductor material comprising $M1O_aN_b$, wherein M1 is a single metal or a combination of metals, a>0, and b≥0.

Optionally, the method further comprises forming an auxiliary etch stop layer on a side of the first electrode distal to the base substrate; the auxiliary etch stop layer and the etch stop layer are formed in a same layer and are made of a same material.

Optionally, the method further comprises forming a data line; wherein the step of forming the data line comprises forming a first sub-layer and forming a second sub-layer; the first sub-layer is formed on a side of the second sub-layer proximal to the base substrate; the first sub-layer is formed in a same layer as the active layer and the first electrode, and is formed using a same material as that of the active layer and the first electrode; and the second sub-layer is formed in a same layer as the first node and the second node, and is formed using a same material as that of the first node and the second node.

Optionally, the second electrode is formed on a side of the first electrode distal to the base substrate.

Optionally, the second electrode is formed on a side of the first electrode proximal to the base substrate.

Optionally, the first electrode is the pixel electrode and the second electrode is the common electrode, the method comprising, forming a gate electrode and a common electrode signal line on the base substrate; forming a gate insulating layer on a side of the gate electrode and the common electrode signal line distal to the base substrate: forming a semiconductor material layer on a side of the gate insulating layer distal to the gate electrode and the common electrode signal line; the semiconductor material comprising $M1O_aN_b$, wherein M1 is a single metal or a combination of metals, a>0, and b≥0; forming an etch stop material layer on a side of the semiconductor material layer distal to the gate insulating layer; patterning the etch stop material layer using a mask plate thereby forming the etch stop layer and an auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line comprising a first sub-layer and a second sub-layer; forming a passivation layer on a side of the first node, the second node, and the data line distal to the gate insulating layer; forming a via extending through the passivation layer and the gate insulating layer; and forming a second electrode on a side of the passivation layer distal to the gate insulating layer; wherein the second electrode is formed to be electrically connected to the common electrode signal line through the via; the step of patterning the electrode material layer and the semiconductor material layer comprises etching the electrode material layer and the semiconductor material layer using a same etchant.

Optionally, the first electrode is the pixel electrode and the second electrode is the common electrode, the method comprising forming a gate electrode, a common electrode signal line, and the second electrode on the base substrate; the second electrode being formed to be electrically connected to the common electrode signal line; forming a gate insulating layer on a side of the gate electrode, the common electrode signal line, and the second electrode distal to the base substrate; forming a semiconductor material layer on a side of the gate insulating layer distal to the gate electrode, the common electrode signal line, and the second electrode; the semiconductor material comprising $M1O_aN_b$, wherein M1 is a single metal or a combination of metals, a>0, and b≥0; forming an etch stop material layer on a side of the semiconductor material layer distal to the gate insulating layer; patterning the etch stop material layer using a mask plate thereby forming the etch stop layer and an auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line comprising a first sub-layer and a second sub-layer; and forming a passivation layer on a side of the first node, the second node, and the data line distal to the gate insulating layer; wherein the step of patterning the electrode material layer and the semiconductor material layer comprises etching the electrode material layer and the semiconductor material layer using a same etchant.

Optionally, the first electrode is the common electrode and the second electrode is the pixel electrode, the method comprising forming a gate electrode, a common electrode signal line, and the second electrode on the base substrate; forming a gate insulating layer on a side of the gate electrode, the common electrode signal line, and the second electrode distal to the base substrate; forming a first via and a second via extending through the gate insulating layer; forming a semiconductor material layer on a side of the gate insulating layer distal to the gate electrode, the common electrode signal line, and the second electrode; forming an etch stop material layer on a side of the semiconductor material layer distal to the gate insulating layer; patterning the etch stop material layer using a mask plate thereby forming the etch stop layer and an auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line comprising a first sub-layer and a second sub-layer; the first electrode electrically connected to the common electrode signal line through the first via, the second node electrically connected to the second electrode through the second via; and forming a passivation layer on a side of the first node, the second node, and the data line distal to the gate insulating layer; wherein the step of patterning the electrode material layer and the semiconductor material layer comprises etching the electrode material layer and the semiconductor material layer using a same etchant.

In another aspect, the present invention provides a display panel, comprising an array substrate described herein or fabricated by a method described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
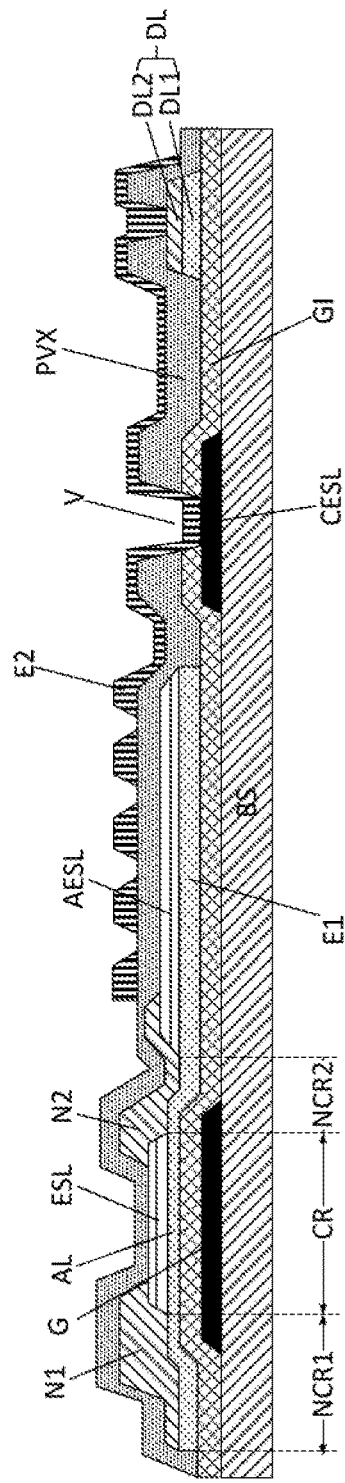
FIG. 1 is a diagram illustrating the structure of an array substrate in some embodiment according to the present disclosure.

The disclosure now be described more specifically with reference to the following embodiments. It is to be noted that the following descriptions of some embodiments are presented herein for purpose of illustration and description only. It is, not intended to be exhaustive or to be limited to the precise form disclosed.

Conventional array substrates having a metal oxide or metal oxynitride thin film transistor typically include an etch stop layer to protect the channel region of the active layer from an etchant for patterning the source electrode and the drain electrode. Particularly, for an array substrate having a "side wing contact" type thin film transistor, a complicated fabricating process involving use of multiple mask plates and multiple metal oxide or metal oxynitride etching is required, resulting in relatively high manufacturing costs.

Accordingly, the present invention provides, inter alia, an array substrate, a display panel and a display apparatus having the same, and a fabricating method thereof that substantially obviate one or more of the problems due to limitations and disadvantages of the related art. In one aspect, the present disclosure provides an array substrate including a base substrate; a first electrode and a second electrode, the first electrode and the second electrode being two different electrodes selected from a pixel electrode and a common electrode; and a thin film transistor including an active layer, an etch stop layer on a side of the active layer distal to the base substrate, a first node, and a second node. The active layer of the present array substrate includes a channel region, a first node contact region and a second node contact region. A projection of the channel region on the base substrate substantially overlaps with that of the etch stop layer. A projection of the first node contact region and the second node contact region on the base substrate are outside that of the etch stop layer. The first node is on a side of the first node contact region distal to the base substrate; and the second node is on a side of the second node contact region distal to the base substrate. The active layer and the first electrode are in a same layer, and are made of a semiconductor material including $M1O_aN_b$, wherein M1 is a single metal or a combination of metals, $a>0$, and $b≥0$.

As used herein, the term "same layer" refers to the relationship between the layers simultaneously formed in the same step. In one example, the active layer and the first electrode are in a same layer when they are formed as a result of one or more steps of a same patterning process performed in a same layer of material, in another example, the active layer and the first electrode can be formed in a same layer by simultaneously performing the step of forming the active layer and the step of forming the first electrode. The Term "same layer" does not always mean that the thickness of the layer or the height of the layer in a cross-sectional view is the same.

In some embodiments, the semiconductor material is a metal oxide. In some embodiments the semiconductor material is a metal oxynitride. Examples of appropriate metal oxide materials for making the active layer and the first electrode include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride materials for making the active layer and the first electrode include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the semiconductor material includes $M1O_aN_b$ doped with one or more metal element. Optionally, the semiconductor material includes $M1O_aN_b$ doped with one or more non-metal element. Optionally, the semiconductor material includes $M1O_aN_b$ doped with one or more metal element and one or more non-metal element.

In some embodiments, the semiconductor material is a photosensitive semiconductor material. Optionally, the photosensitive semiconductor material is a metal oxide. Optionally, the photosensitive semiconductor material is a metal oxynitride. Examples of photosensitive semiconductor material include, but are not limited to, indium gallium zinc oxide, indium zinc hafnium, indium zinc zirconium oxide, indium zinc tin oxide, indium zinc oxide, aluminum indium zinc oxide, zinc oxide, and aluminum indium zinc oxide. Optionally, the photosensitive semiconductor material includes at least one metal selected from indium, calcium, aluminum, zinc, cadmium, gallium, molybdenum, tin, hafnium, copper, titanium, barium, and zirconium. Optionally, the photosensitive semiconductor material includes indium gallium zinc oxide.

By using a photosensitive semiconductor material for making the first electrode (e.g., the pixel electrode), the mobility rate of the first electrode in the present array substrate may be significantly improved by light irradiation (e.g., light from a back light). The channel region of the active layer, on the other hand, is shielded from light irradiation by the gate electrode. Thus, the mobility rate of the channel region is not significantly affected by, the light irradiation, and no significant leakage current is produced in the thin film transistor by light irradiation. By having a design in which the pixel electrode is exposed to back light irradiation, a higher conductive current may be achieved in the pixel electrode in the present array substrate. Accordingly, the pixel electrode can be charged in a short time period.

In some embodiments, the second electrode is on a side of the first electrode distal to the base substrate. Optionally, the first electrode is the pixel electrode and the second electrode is the common electrode. Optionally, the first electrode is the common electrode and the second electrode is the pixel electrode.

In some embodiments, the second electrode is on a side of the first electrode proximal to the base substrate. Optionally, the first electrode is the pixel electrode and the second electrode is the common electrode. Optionally, the first electrode is the common electrode and the second electrode is the pixel electrode.

Optionally, the first node (e.g., a source electrode or a drain electrode) is in contact with and on a side of the first node contact region distal to the base substrate. Optionally, the second node (e.g., a drain electrode or a source electrode) is in contact with and on a side of the second node contact region distal to the base substrate. Optionally, the first node (e.g., a source electrode or a drain electrode) is on a side of the first node contact region distal to the base substrate, and the thin film transistor further includes an ohmic contact layer between the first node and the first node contact region. Optionally, the second node (e.g., a drain electrode or a source electrode) is on a side of the second node contact region distal to the base substrate, and the thin film transistor further includes an ohmic contact layer between the second node and the second node contact region.

In some embodiments, the array substrate further includes an auxiliary etch stop layer on a side of the first electrode distal to the base substrate; the auxiliary etch stop layer and the etch stop layer are in a same layer and are made of a same material, e.g., a silicon-containing compound. Examples of silicon-containing compounds for making the etch stop layer or the auxiliary etch stop layer include, but are not limited to, silicon oxide, silicon nitride, silicon oxynitride, silicon carbide, silicon oxycarbide, silicon, and silicon germanium.

In some embodiments, the array substrate further includes a data line having a first sub-layer and a second sub-layer, the first sub-layer on a side of the second sub-layer proximal to the base substrate. Optionally, the first sub-layer is in a same layer as the active layer and the first electrode, and is made of a same material as that of the active layer and the first electrode, e.g., a semiconductor material including $M1O_aN_b$, wherein M1 is a single metal or a combination of metals, a>0, and b≥0. Optionally, the second sub-layer is in a same layer as the first node and the second node, and is made of a same material as that of the first node and the second node, e.g., an electrode material.

FIG. 1 is a diagram illustrating the structure of an array substrate in some embodiments according to the present disclosure. Referring to the FIG. 1, the array substrate includes a base substrate BS, a gate electrode G and a common electrode signal line CESL on the base substrate BS, a gate insulating layer GI on a side of the gate electrode G and the common electrode signal line CESL distal to the base substrate BS, an active layer AL and a first electrode E1 (e.g., a pixel electrode) on a side of the gate insulating layer GI distal to the base substrate BS, an etch stop layer ESL on a side of the active layer AL distal to the gate insulating layer GI, a first node N1 (e.g., source electrode) and a second node N2 (e.g., drain electrode) on a side of the active layer AL distal to the gate insulating layer GL.

As shown in FIG. 1, the active layer AL includes a channel region CR, a first node contact region NCR1 and a second node contact region NCR2. A projection of the channel region CR on the base substrate BS substantially overlaps with that of the etch stop layer ESL. A projection of the first node contact region NCR1 and the second node contact region NCR2 on the base substrate BS are outside that of the etch stop layer ESL. The first node N1 is on a side of the first node contact region NCR1 distal to the base substrate BS, and the second node N2 is on a side of the second node contact region NCR2 distal to the base substrate BS.

In some embodiments, the active layer AL and the first electrode E1 are in a same layer, and are made of a semiconductor material including $M1O_aN_b$, wherein M1 is a single metal or a combination of metals, a>0, and b≥0. Optionally, when the first electrode E1 is a pixel electrode, the first electrode E1 and the active layer AL are electrically connected, e.g., the active layer AL and the first electrode E1 are a continuous layer. Optionally, when the first electrode E1 is a common electrode, the first electrode E1 and the active layer AL are insulated from each other.

Referring to FIG. 1, the array substrate in the embodiment further includes an auxiliary etch stop layer AESL on a side of the first electrode E1 distal to the base substrate BS. The auxiliary etch stop layer AESL and the etch stop layer ESL are in a same layer and are made of a same material. As used herein, the term "etch stop layer" refers to a layer that prevents etching of an underlying active layer. As used herein, the term "auxiliary etch stop layer" refers to a layer that prevents etching of an underlying first electrode. Optionally, the etch stop layer or the auxiliary etch stop layer is substantially resistant to an etchant for etching the first node and the second node (e.g., the source electrode and the drain electrode). Optionally, the etch stop layer or the auxiliary etch stop layer is substantially resistant to a wet etchant for etching the first node and the second node. Optionally, the etch stop layer or the auxiliary etch stop layer is made of a silicon-containing compound. Examples of silicon-containing compounds for making the etch stop layer or the auxiliary etch stop layer include, but are not limited to, silicon oxide, silicon nitride, silicon oxynitride, silicon carbide, silicon oxycarbide, silicon, and silicon germanium.

Referring to FIG. 1, the array substrate in the embodiment further includes a data line DL. The data line DL includes a first sub-layer DL1 and a second sub-layer DL2, the first sub-layer DL1 is on a side of the second sub-layer DL2 proximal to the gate insulating layer GL. In the present array substrate, the first side-layer DL1 is in a same layer as the active layer AL and the first electrode E1 (e.g., a pixel electrode), and is made of a same material as that of the active layer AL and the first electrode E1. Optionally, the first sub-layer DL1, the active layer AL, and the first electrode E1 are formed in a same patterning process. In the present array substrate, the second sub-layer DL2 is in a same layer as the first node N1 and the second node N2, and is made of a same material as that of the first node N1 and the second node N2. Optionally, the second sub-layer DL2, the first node N1, and the second node N2 are formed in a same patterning process. For example, in some embodiments, a semiconductor material layer is first formed on the base substrate BS. Subsequently, an etch stop material layer (e.g., a silicon-containing compound layer) is formed on a side of the semiconductor material layer distal to the base substrate BS, and the etch stop material layer is patterned to form the etch stop layer ESL and the auxiliary etch stop layer AESL on a side of the semiconductor material layer distal to the base substrate BS. Subsequently, an electrode material layer is formed on a side of the etch stop layer ESL and the auxiliary etch stop layer AESL distal to the semiconductor material layer. The active layer AL, the first electrode E1, the first sub-layer DL1 the second sub-layer DL2 the first node N1 and the second node N2 are patterned using a single mask plate, e.g., by etching the conductive electrode material layer using an etchant, thereby forming the first node N1, the second node N2, and the second sub-layer DL2, the semiconductor material layer is over etched by the etchant where it is exposed to the etchant, the semiconductor material layer is protected where it has the etch stop layer ESL, the auxiliary etch stop layer AESL, the first node N1, the second node N2, and the second sub-layer DL2 on its top. As such, the active layer AL, the first electrode E1, and the data line DL having the first sub-layer DL1 and the second sub-layer DU are formed.

Referring to FIG. 1, the array substrate in the embodiment further includes a passivation layer PVX on a side of the first node N1 and the second node N2 distal to the base substrate BS. In FIG. 1, the array substrate further includes a second electrode E2 (e.g., a common electrode) on a side of the passivation layer PVX distal to the base substrate BS. When the second electrode E2 is a common electrode, the array substrate further includes a via V extending through the passivation layer PVX and the gate insulating layer GI, and the second electrode E2 is electrically connected to the common electrode signal line CESL through the via V. Optionally, the second electrode E2 is made of indium tin oxide.

Figure 2:
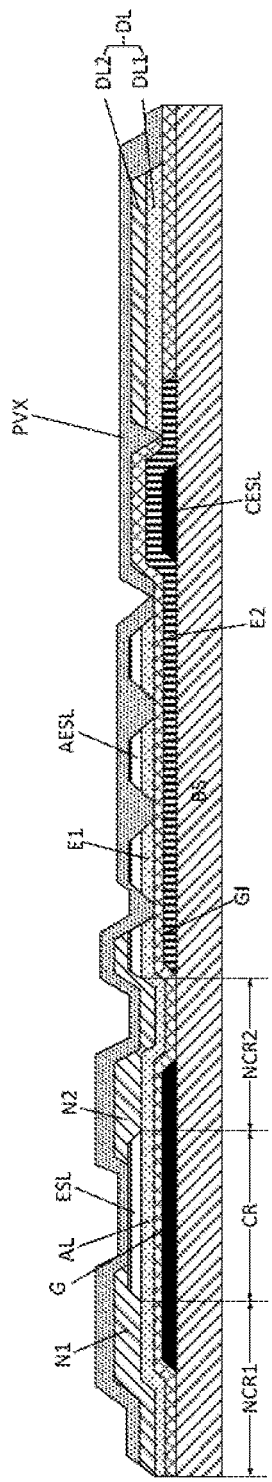
FIG. 2 is a diagram illustrating the structure of are array substrate in some embodiment according to the present disclosure.

FIG. 2 is a diagram illustrating the structure of an array substrate in some embodiment according to the present disclosure. Referring to FIG. 2, the array substrate includes a base substrate BS; a gate electrode G, second electrode E2 (e.g., a common electrode), and a common electrode signal line CESL on the base substrate BS; a gate insulating layer GI on a side of the gate electrode G, the second electrode E2, and the common electrode signal line CESL distal to the base substrate BS; an active layer AL and a first electrode E1 (e.g., a pixel electrode) on a side of the gate insulating layer GI distal to the base substrate BS; an etch stop layer ESL on a side of the active layer AL distal to the gate insulating layer GI; a first node N1 (e.g., source electrode) and a second node N2 (e.g., drain electrode) on a side of the active layer AL distal to the gate insulating layer GL.

As shown in FIG. 2, the active layer AL includes a channel region CR, a first node contact region NCR1 and a second node contact region NCR2. A projection of the channel region CR on the base substrate BS substantially overlaps with that of the etch stop layer ESL. A projection of the first node contact region NCR1 and the second node contact region NCR2 on the base substrate BS are outside that of the etch stop layer ESL. The first node N1 is on a side of the first node contact region NCR1 distal to the base substrate BS, and the second node N2 is on a side of the second node contact region NCR2 distal to the base substrate BS.

In some embodiments, the active layer AL and the first electrode E1 are in a same layer, and are made of a semiconductor material including $M1O_aN_b$, wherein M1 is a single metal or a combination of metals, $a>0$, and $b\geq0$. Optionally, when the first electrode E1 is a pixel electrode, the first electrode E1 and the active layer AL are electrically connected, e.g., the active layer AL and the first electrode E1 are a continuous layer. Optionally, when the first electrode E1 is a common electrode, the first electrode E1 and the active layer AL are insulated from each other.

Referring to FIG. 2, the array substrate in the embodiment further includes an auxiliary etch stop layer AESL on a side of the first electrode E1 distal to the base substrate BS. The auxiliary etch stop layer AESL and the etch stop layer ESL are in a same layer and are made of a same material.

Referring to FIG. 2, the array substrate in the embodiment further includes a data line DL. The data line DL includes a first sub-layer DL1 and a second sub-layer DL2, the first sub-layer DL1 is on a side of the second sub-layer DL2 proximal to the gate insulating layer GL. In the present array substrate, the first sub-layer DL1 is in a same layer as the active layer AL and the first electrode E1 (e.g., a pixel electrode), and is made of a same material as that of the active layer AL and the first electrode E1. In some examples, the second sub-layer DL2 is in a same layer as the first node N1 and the second node N2, and is made of a same material as that of the first node N1 and the second node N2. Optionally, the active layer AL, the first electrode E1, the first sub-layer DL1, the second sub-layer DL2, the first node N1 and the second node N2 may be patterned in a single process. For example, in some embodiments, a semiconductor material layer is first formed on the base substrate BS. Subsequently, an etch stop material layer (e.g., a silicon-containing compound layer) is formed on a side of the semiconductor material layer distal to the base substrate BS, and the etch stop material layer is patterned to form the etch stop layer ESL and the auxiliary etch stop layer AESL on a side of the semiconductor material layer distal to the base substrate BS. Subsequently, an electrode material layer is formed on a side of the etch stop layer ESL and the auxiliary etch stop layer AESL distal to the semiconductor material layer. The active layer AL, the first electrode E1, the first sub-layer DL1, the second sub-layer DL2, the first node N1 and the second node N2 are patterned using a single mask plate, e.g., by etching the conductive electrode material layer using an etchant, thereby forming the first node N1, the second node N2, and the second sub-layer DL2, the semiconductor material layer is over-etched by the etchant where it is exposed to the etchant, the semiconductor material layer is protected where it has the etch stop layer ESL, the auxiliary etch stop layer AESL, the first node N1, the second node N2, and the second sub-layer DL2 on its top. As such, the active layer AL, the first electrode E1, and the data line DL having the first sub-layer DL1 and the second sub-layer DL2 are formed.

Referring to FIG. 2, the array substrate in the embodiment further includes a passivation layer PVX on a side of the first node N1, and the second node N2 distal to the base substrate BS.

Referring to FIG. 2, the second electrode E2 in the embodiment is a common electrode. In FIG. 2, the second electrode E2 is electrically connected to the common electrode signal line CESL. The second electrode E2 is on a side of the gate insulating layer GI proximal to the base substrate BS. Optionally, the second electrode E2 is made of indium tin oxide.

Figure 3:
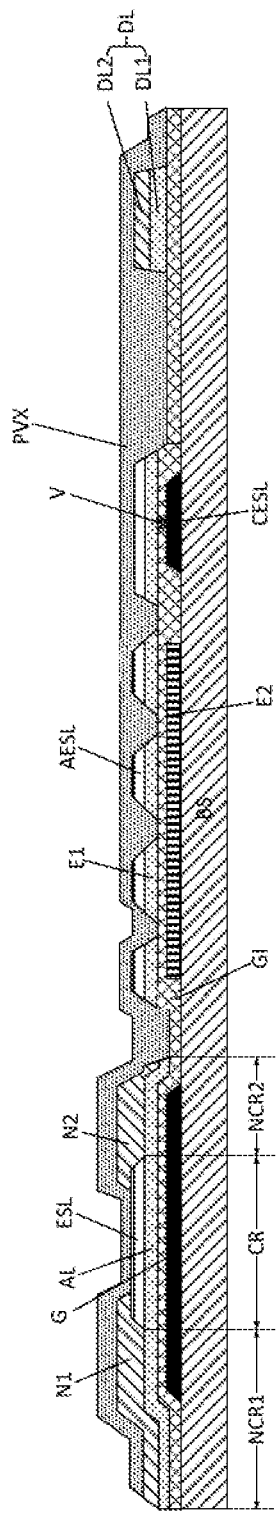
FIG. 3 is a diagram illustrating the structure of an array substrate in some embodiment according to the present disclosure.

In some embodiments, the second electrode E2 is a pixel electrode and the first electrode E1 is a common electrode. FIG. 3 is a diagram illustrating the structure of an array substrate in some embodiment according to the present disclosure. Referring to FIG. 3, the array substrate has a structure similar to that in FIG. 2, with a number of differences. The first electrode E1 in FIG. 3 is a common electrode, and the second electrode E2 is a pixel electrode. The second electrode E2 is on a side of the first electrode E1 proximal to the base substrate BS. As shown in FIG. 3, the active layer AL is insulated from the first electrode E1, and the second electrode E2 (the pixel electrode) is not electrically connected to (i.e., insulated from) the common electrode signal line CESL. The array substrate in FIG. 3 further includes a first via V extending through the gate insulating layer GI. The first electrode E1 (i.e., the common electrode) is electrically connected to the common electrode signal line CESL through the first via. V. The array substrate further includes a second via (not explicitly shown in FIG. 3) extending through gate insulating layer GI, the second node N2 (i.e., the drain electrode) is electrically connected to the second electrode E2 through the second via. Optionally, a projection of the first via V on the common electrode signal line CESL only partially overlaps with the common electrode signal line CESL so that the first via V is not completely shielded by the common electrode signal line CESL. The conductivity of the semiconductor material in the first via V can be enhanced by light irradiation. Optionally, the projection of the first via V on the common electrode signal line CESL only minimally overlaps with the common electrode signal line CESL. Optionally, the projection of the first via V on the base substrate BS is outside that of the common electrode signal line CESL, and the array substrate further includes a transparent electrode bridge electrically connecting the semiconductor material in the first via V and the common electrode signal line CESL. Optionally, the transparent electrode bridge is in a same layer as the second electrode E1, and may be made of a transparent electrode material (e.g., indium tin oxide).

Figure 4A:
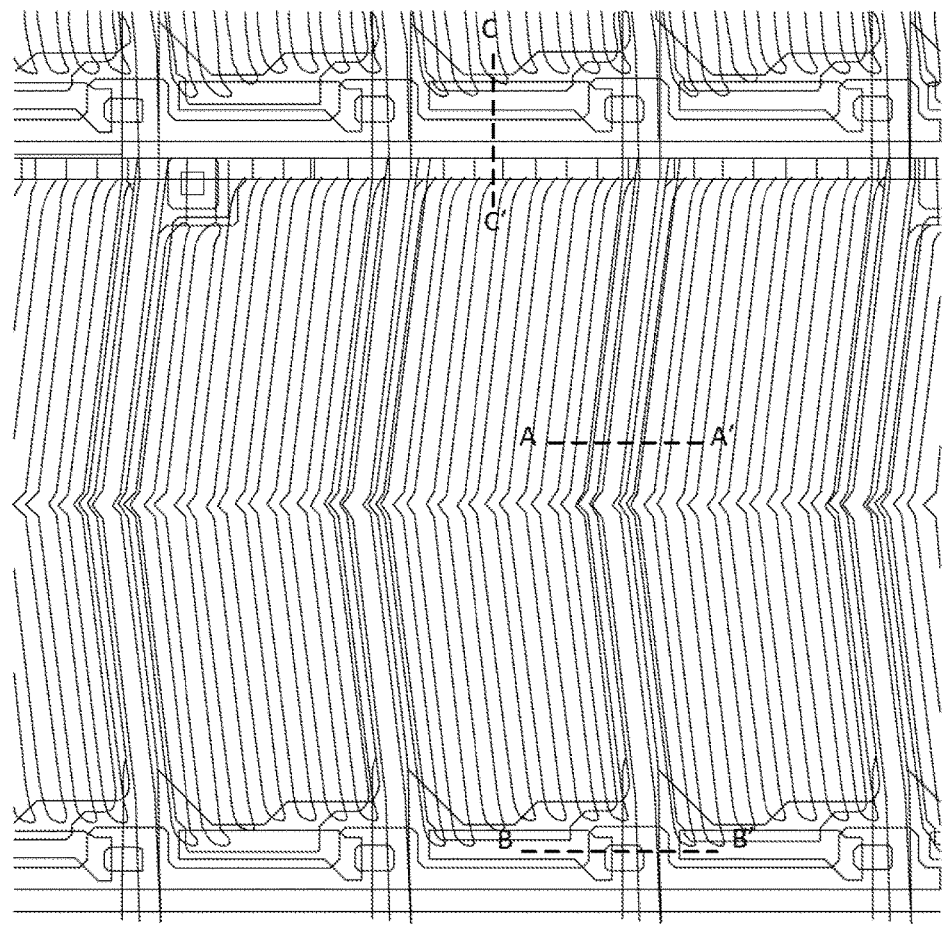
FIG. 4A is a diagram illustrating the structure of an array substrate in some embodiment according to the present disclosure.
Figure 4B:
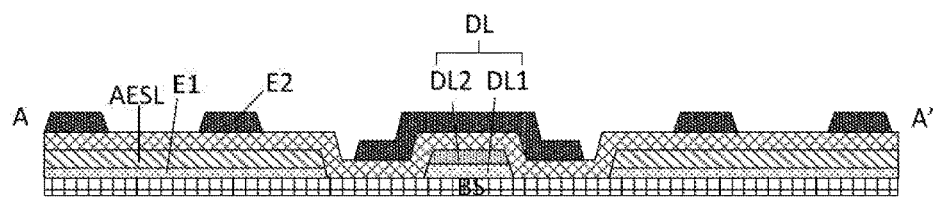
FIG. 4B is a cross-sectional view along the A-A' direction of the array substrate in FIG. 4A.
Figure 4C:
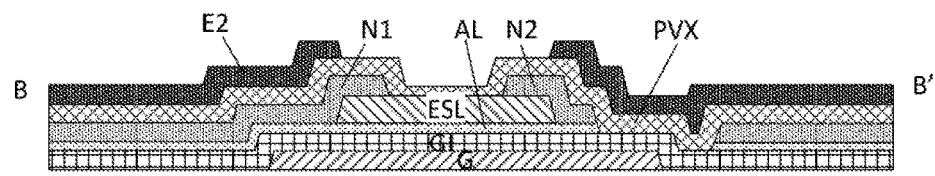
FIG. 4C is a cross-sectional view along the B-B' direction of the array substrate in FIG. 4A.
Figure 4D:
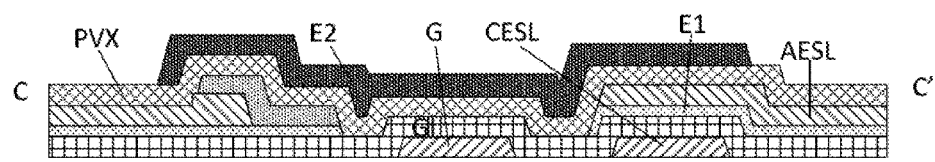
FIG. 4D is a cross-sectional view along the C-C' direction of the array substrate in FIG. 4A.

FIG. 4A is a diagram illustrating the structure of an array substrate in some embodiment according to the present disclosure. FIG. 4B is a cross-sectional view along the A-A' direction of the array substrate in FIG. 4A. FIG. 4C is a cross-sectional view along the B-B' direction of the array substrate in FIG. 4A. FIG. 4D is a cross-sectional view along the C-C' direction of the array substrate in FIG. 4A. In the array substrate of FIGS. 4A-4D, the first electrode E1 is on a side of the second electrode E2 proximal to the base substrate BS. The first electrode E1 in this example is a pixel electrode, and the second electrode E2 is a common electrode. As discussed above, in fabricating such an array substrate, the active layer AL, the first electrode E1, and the data line DL can be patterned using a single mask plate. Thus, the array substrate may be fabricated using one less mask plate as compared to the conventional array substrate, resulting in a simplified manufacturing process and a lower manufacturing cost. Moreover, the aperture ratio in the present array substrate is enhanced, and the mobility rate of the thin film transistor is increased. In the exemplary array substrate shown in FIGS. 4A-4D, an aperture ratio of 74% is achieved. A similar conventional array substrate typically has an aperture ratio of around 72%. Thus, a 2.8% increase in aperture ratio is obtained in the present array substrate.

In another aspect, the present disclosure provides a method of fabricating an array substrate. In some embodiments, the method includes forming a first electrode and a second electrode on a base substrate, the first electrode and the second electrode being two different electrodes selected from a pixel electrode and a common electrode; and forming a thin film transistor having an active layer, an etch stop layer on a side of the active layer distal to the base substrate, a first node, and a second node. The active layer according to the present method is formed to have a channel region, a first node contact region, and a second node contact region. A projection of the channel region on the base substrate substantially overlaps with that of the etch stop layer. A projection of the first node contact region and the second node contact region on the base substrate are outside that of the etch stop layer. The first node is formed on a side of the first node contact region distal to the base substrate, and the second node is formed on a side of the second node contact region distal to the base substrate. The active layer and the first electrode are formed in a same layer, and are formed using a semiconductor material including $M1O_aN_b$, wherein. M1 is a single metal or a combination of metals, $a>0$, and $b \geq 0$. Optionally, the semiconductor material is a photosensitive semiconductor material.

By using a photosensitive semiconductor material for making the first electrode (e.g., the pixel electrode), the mobility rate of the first electrode in the present array substrate may be significantly improved by light irradiation (e.g., light from a back light). The channel region of the active layer, on the other hand, is shielded from light irradiation by the gate electrode. Thus, the mobility rate of the channel region is not significantly affected by the light irradiation, and no significant leakage current is produced in the thin film transistor by light irradiation. By having a design in which the pixel electrode is exposed to back light irradiation, a higher conductive current may be achieved in the pixel electrode in the present array substrate. Accordingly, the pixel electrode can be charged in a short time period.

In some embodiments, the method further includes forming an auxiliary etch stop layer on a side of the first electrode distal to the base substrate; the auxiliary etch stop layer and the etch stop layer are formed in a same layer and are made of a same material, e.g., a silicon-containing compound. Examples of silicon-containing compounds for making the etch stop layer or the auxiliary etch stop layer include, but are not limited to, silicon oxide, silicon nitride, silicon oxynitride, silicon carbide, silicon oxycarbide, silicon, and silicon germanium.

In some embodiments, the method further includes forming a data line having a first sub-layer and a second sub-layer, the first sub-layer is formed on a side of the second sub-layer proximal to the base substrate. Optionally, the first sub-layer is formed in a same layer as the active layer and the pixel electrode, and is formed using a same material as that of the active layer and the pixel electrode, e.g., a semiconductor material including $M1O_aN_b$, wherein M1 is a single metal or a combination of metals, $a>0$, and $b \geq 0$. Optionally, the second sub-layer is formed in a same layer as the first node and the second node, and is formed using a same material as that of the first node and the second node, e.g., an electrode material.

In some embodiments, the second electrode is formed on a side of the first electrode distal to the base substrate. Optionally, the first electrode is the pixel electrode and the second electrode is the common electrode. Optionally, the first electrode is the common electrode and the second electrode is the pixel electrode.

In some embodiments, the second electrode is formed on a side of the first electrode proximal to the base substrate. Optionally, the first electrode is the pixel electrode and the second electrode is the common electrode. Optionally, the first electrode is the common electrode and the second electrode is the pixel electrode.

Optionally, the first node (e.g., a source electrode or a drain electrode) is formed to be in contact with and on a side of the first node contact region distal to the base substrate. Optionally, the second node (e.g., a drain electrode or a source electrode) is formed to be in contact with and on a side of the second node contact region distal to the base substrate. Optionally, the first node (e.g., a source electrode or a drain electrode) is formed on a side of the first node contact region distal to the base substrate, and the method further includes forming an ohmic contact layer between the first node and the first node contact region. Optionally, the second node (e.g., a drain electrode or a source electrode) is formed on a side of the second node contact region distal to the base substrate, and the method further includes forming an ohmic contact layer between the second node and the second node contact region.

In one example, the first electrode is the pixel electrode and the second electrode is the common electrode. The method includes forming a gate electrode and a common electrode signal line on the base substrate; forming a gate insulating layer on a side of the gate electrode and the common electrode signal line distal to the base substrate; forming a semiconductor material layer on a side of the gate insulating layer distal to the gate electrode and the common electrode signal line, the semiconductor material including, $M1O_aN_b$, wherein M1 is a single metal or a combination of metals, a>0, and b≥0; forming an etch stop material layer on a side of the semiconductor material layer distal to the gate insulating layer; patterning the etch stop material layer using a mask plate thereby forming the etch stop layer and the auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line having the first sub-layer and the second sub-layer: forming a passivation layer on a side of the first node, the second node, and the data line distal to the gate insulating layer; forming a via extending through the passivation layer and the gate insulating layer; and forming a second electrode on a side of the passivation layer distal to the gate insulating layer. Optionally, the second electrode is formed to be electrically connected to the common electrode signal line through the via. Optionally, the step of patterning the electrode material layer and the semiconductor material layer includes etching the electrode material layer and the semiconductor material layer using a same etchant.

In another, example, the first electrode is the pixel electrode and the second electrode is the common electrode. The method includes forming a gate electrode, a common electrode signal line, and the second electrode on the base substrate, the second electrode electrically connected to the common electrode signal line; forming a gate insulating layer on a side of the gate electrode, the common electrode signal line, and the second electrode distal to the base substrate; forming a semiconductor material layer on a side of the gate insulating layer distal to the gate electrode, the common electrode signal line, and the second electrode, the semiconductor material including $M1O_aN_b$, wherein M1 is a single metal or a combination of metals, a>0, and b≥0; forming an etch stop material layer on a side of the semiconductor material layer distal to the gate insulating layer; patterning the etch stop material layer using a mask plate thereby forming the etch stop layer and the auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line laying the first sub-layer and the second sub-layer; and forming a passivation layer on a side of the first node, the second node, and the data line distal to the gate insulating layer. Optionally, the step of patterning the electrode material layer and the semiconductor material layer includes etching the electrode material layer and the semiconductor material layer using a same etchant.

In yet another example, the first electrode is the common electrode and the second electrode is the pixel electrode. The method includes forming a gate electrode, a common electrode signal line, and the second electrode on the base substrate; forming a gate insulating layer on a side of the gate electrode, the common electrode signal line, and the second electrode distal to the base substrate: forming a via extending through the gate insulating layer forming a semiconductor material layer on a side of the gate insulating layer distal to the gate electrode, the common electrode signal line, and the second electrode; forming an etch stop material layer on a side of the semiconductor material layer distal to the gate insulating layer; patterning the etch stop material layer using a mask plate thereby forming the etch stop layer and the auxiliary etch stop layer; forming an electrode material layer on a side of the etch stop layer and the auxiliary etch stop layer distal to the semiconductor material layer; patterning the electrode material layer and the semiconductor material layer using a single mask plate, thereby forming the first node, the second node, the active layer, the first electrode, and the data line having the first sub-layer and the second sub-layer, the second node electrically connected to the second electrode through the via; and forming a passivation layer on a side of the first node, the second node, and the data line distal to the gate insulating layer. Optionally, the step of patterning the electrode material layer and the semiconductor material layer includes etching the electrode material layer and the semiconductor material layer using a same etchant.

Figure 5A:
FIGS. 5A-5E illustrate a process of fabricating an array substrate in some embodiment according to the present disclosure.
Figure 5B:
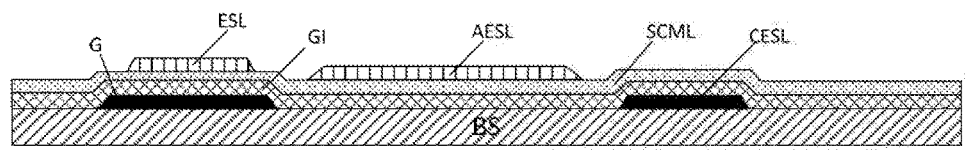

FIGS. 5A-5E illustrate a process of fabricating an array substrate in some embodiment according to the present disclosure. Referring to FIG. 5A, the method first includes forming a gate electrode G and a common electrode signal line CESL on the base substrate BS. FIG. 5B shows a step of forming a gate insulating layer GI on a side of the gate electrode G and the common electrode signal line CESL distal to the base substrate BS, a step of forming a semiconductor material layer SCML on a side of the gate insulating layer GI distal to the gate electrode G and the common electrode signal line CESL, and a step of forming an etch stop layer ESL and an auxiliary etch stop layer AESL on a side of the semiconductor material layer SCML distal to the gate insulating layer GL. The semiconductor material includes $M1O_aN_b$, wherein M1 is a single metal or a combination of metals, a>0, and b≥0. Optionally, the etch stop layer ESL and the auxiliary etch stop layer AESL is formed by depositing an etch stop material layer on a side of the semiconductor material layer SCML distal to the gate insulating layer GI, and patterning the etch stop material layer using a mask plate.

Optionally, the semiconductor material layer may be formed by, e.g., coating, magnetron sputtering, and vapor deposition such as plasma enhanced chemical vapor deposition (PEVCD).

Optionally, the etch stop material layer may be formed by, e.g., coating, magnetron sputtering, and vapor deposition such as plasma enhanced chemical vapor deposition (PEVCD).

Optionally, the etch stop material layer may be removed by an etching process, e.g., a dry etching process.

Figure 5C:
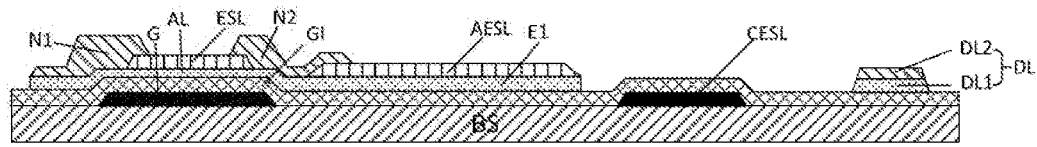

Referring to FIG. 5C, the method further includes forming a first node N1, a second node N2, an active layer AL, a first electrode E1, and a data line DL on a side of the gate insulating layer GI distal to the base substrate BS. As compared to conventional methods, the present method uses one less mask plate, i.e., the first node N1, the second node N2, the active layer AL, the first electrode E1, and the data line DL may be formed in a single patterning step using a single mask plate. Specifically, the method may include a step of depositing an electrode material layer on a side of the etch stop layer ESL and the auxiliary etch stop layer AESL distal to the semiconductor material layer SCML; and a step of patterning the electrode material layer and the semiconductor material layer SCML using a single mask plate having a pattern corresponding to the first node N1, the second node N2, and the data line DL, e.g., using an etchant capable of etching both the electrode material layer and the semiconductor material layer SCML. The electrode material layer is removed in areas other than those corresponding to the first node N1, the second node N2, and the data line DL, thereby forming the first node N1, the second node N2, and the data line DL. The semiconductor material layer SCML is over-etched by the etchant and removed in areas where the semiconductor material layer SCML is exposed to the etchant. The semiconductor material layer SCML remains in areas where it is protected by the etch stop layer ESL or the auxiliary etch stop layer AESL; or in areas corresponding to the data line DL, the first node N1, and the second node N2. When the over-etching is complete, the active layer AL, the first node N1, the second node N2, and the data line DL having a first sub-layer DL1 and a second sub-layer DL2 are formed.

Various appropriate electrode materials and various appropriate fabricating methods may be used for making the electrode material layer. For example, an electrode material may be deposited on the substrate (e.g., by sputtering, vapor deposition, solution coating, or spin coating); and patterned (e.g., by lithography such as a wet etching process) to form the first node, the second node, and the second sub-layer of the data line. Examples of appropriate semiconductor materials for making the electrode material layer include, but are not limited to, various metal materials such as nano-silver, molybdenum, aluminum, silver, chromium, tungsten, titanium, tantalum, copper, and alloys or laminates containing the same; and various conductive metal oxides such as indium tin oxide.

Figure 5D:
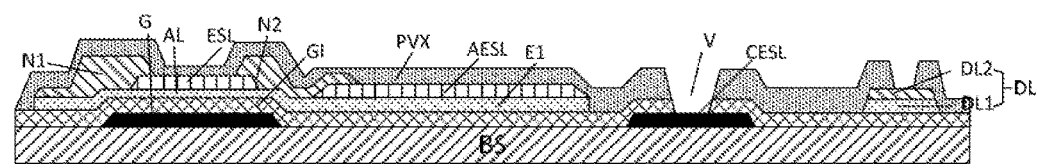

Referring to FIG. 5D, the method further includes a step of forming a passivation layer PVX on a side of the first node N1 the second node N2, and the data line DL distal to the gate insulating layer GI, and a step of forming a via V extending through the passivation layer PVX and the gate insulating layer GI.

Figure 5E:
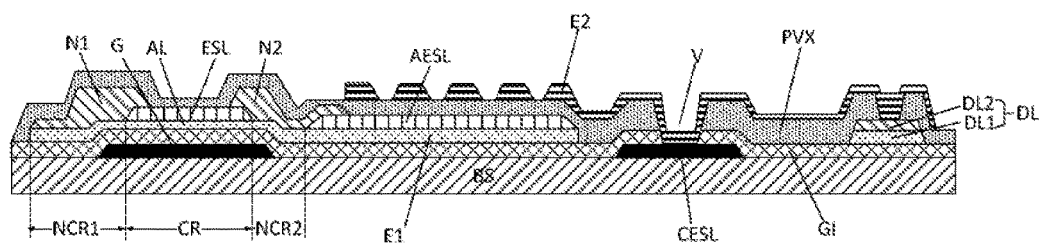

Referring to FIG. 5E, the method further includes a step of forming a second electrode E2 on a side of the passivation layer PVX distal to the gate insulating layer GI, the second electrode E2 is electrically connected to the common electrode signal line CESL through the via V. Optionally, the first electrode E1 in the array substrate fabricated by the method of FIGS. 5A-5E is a pixel electrode, and the second electrode E2 is a common electrode.

Figure 6A:
FIGS. 6A-6E illustrate a process of fabricating an array substrate in some embodiment according to the present disclosure.
Figure 6B:
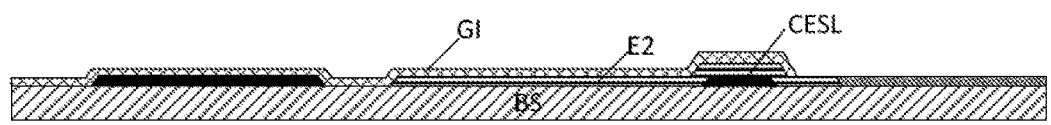
Figure 6C:

FIGS. 6A-6E illustrate a process of fabricating an array substrate in some embodiment according to the present disclosure. Referring to FIG. 6A, the method first includes a step of forming a gate electrode G, a common electrode signal line CESL, and a second electrode E2 on the base substrate BS. The second electrode E2 is formed to be electrically connected to the common electrode signal line CESL. Referring to FIG. 6B, the method further includes a step of forming a gate insulating layer GI on a side of the gate electrode G, the common electrode signal line CESL, and the second electrode E2 distal to the base substrate BS. Referring to FIG. 6C, the method further includes a step of forming a semiconductor material layer SCML on a side of the gate insulating layer GI distal to the gate electrode G, the common electrode signal line CESL, and the second electrode E2, and a step of forming an etch stop layer ESL and an auxiliary etch stop layer AESL on a side of the semiconductor material layer SCML distal to the gate insulating layer GL. The semiconductor material includes $M1O_aN_b$, wherein M1 is a single metal or a combination of metals, a>0, and b≥0. Optionally, the etch stop layer ESL and the auxiliary etch stop layer AESL is formed by depositing an etch stop material layer on a side of the semiconductor material layer SCML distal to the gate insulating layer GL and patterning the etch stop material layer using a mask plate.

Figure 6D:

Referring to FIG. 6D, the method further includes forming a first node N1, a second node N2, an active layer AL, a first electrode E1, and a data line DL on a side of the gate insulating layer GI distal to the base substrate BS. As compared to conventional methods, the present method uses one less mask plate, i.e., the first node N1, the second node N2, the active layer AL, the first electrode E1, and the data line DL may be formed in a single patterning step using a single mask plate. Specifically, the method may include a step of depositing an electrode material layer on a side of the etch stop layer ESL and the auxiliary etch stop layer AESL distal to the semiconductor material layer SCML; and a step of patterning the electrode material layer and the semiconductor material layer SCML using a single mask plate having a pattern corresponding to the first node N1, the second node N2, and the data line DL, e.g., using an etchant capable of etching both the electrode material layer and the semiconductor material layer SCML. The electrode material layer is removed in areas other than those corresponding to the first node N1, the second node N2, and the data line DL, thereby forming the first node N1, the second node N2, and the data line DL. The semiconductor material layer SCML is over-etched by the etchant and removed in areas where the semiconductor material layer SCML is exposed to the etchant. The semiconductor material layer SCML remains in areas where it is protected by the etch stop layer ESL or the auxiliary etch stop layer AESL; or in areas corresponding to the data line DL, the first node N1, and the second node N2. When the over-etching is complete, the active layer AL, the first node N1, the second node N2, and the data line DL having a first sub-layer DL1 and a second sub-layer DL2 are formed.

Figure 6E:
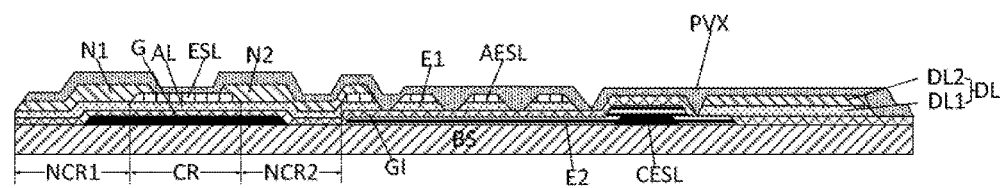

Referring to FIG. 6E, the method further includes a step of forming a passivation layer PVX on a side of the first node N1, the second node N2, and the data line DL distal to the gate insulating layer GI. Optionally, the first electrode E1 in the array substrate fabricated by the method of FIGS. 6A-6E is a pixel electrode, and the second electrode E2 is a common electrode.

In the present method, the active layer and the first electrode layer (e.g., a pixel electrode) are formed in a same patterning process using a same mask plate, obviating the need of using two separate mask plates, one for patterning the active layer and one for patterning the pixel electrode. During the process of etching the electrode material layer to form the first node and the second node, the semiconductor material layer beneath the electrode material layer can also be etched (using a same or different etchant) to form the active layer and the pixel electrode layer using the mask plate for forming the first node and the second node, the etch stop layer, and the auxiliary etch stop layer as the protective mask, obviating the need of two separate etching steps. As a result, the fabricating process is much simplified. Because the thin film transistor fabricated by the present method includes an etch stop layer on the active layer, transistor reliability is preserved.

In another aspect, the present disclosure provides a display panel having an array substrate described herein or fabricated by a method described herein.

In another aspect, the present disclosure provides a display apparatus having a display panel described herein. Examples of appropriate display apparatuses include, but are not limited to, a liquid crystal display panel, an electronic paper, an organic light emitting display panel, a mobile phone, a tablet computer, a television, a monitor, a notebook computer, a digital album, a GPS, etc.

The foregoing description of the embodiments of the invention has been presented for purposes of illustration and description. It is not intended to be exhaustive or to omit the invention to, the precise form or, to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc., following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate;
a first electrode and a second electrode, the first electrode and the second electrode being two different electrodes selected from a pixel electrode and a common electrode;
a data line; and
a thin film transistor comprising an active layer, an etch stop layer on a side of the active layer away from the base substrate, a first node, and a second node;
wherein the active layer comprises a channel region, a first node contact region, and a second node contact region; a projection of the channel region on the base substrate substantially overlaps with that of the etch stop layer; a projection of the first node contact region and the second node contact region on the base substrate are outside that of the etch stop layer;
the first node is on a side of the first node contact region away from the base substrate; and the second node is on a side of the second node contact region away from the base substrate;
an orthographic projection of at least a first portion of the first electrode on the base substrate overlaps with an orthographic projection of the second electrode on the base substrate; and
the active layer and at least the first portion of the first electrode are in a same layer, and are made of a semiconductor material comprising $M1O_aN_b$, wherein M1 is a single metal or a combination of metals, $a>0$, and $b \geq 0$;
wherein the data line comprises a first sub-layer and a second sub-layer; the first sub-layer on a side of the second sub-layer closer to the base substrate;
the first sub-layer is in a same layer as the active layer and the first electrode, and is made of a same material as that of the active layer and the first electrode; and
the second sub-layer is in a same layer as the first node and the second node, and is made of a same material as that of the first node and the second node.

2. An array substrate, comprising:
a base substrate;
a first electrode and a second electrode, the first electrode and the second electrode being two different electrodes selected from a pixel electrode and a common electrode; and
a thin film transistor comprising an active layer, an etch stop layer on a side of the active layer away from the base substrate, a first node, and a second node;
wherein the active layer comprises a channel region, a first node contact region, and a second node contact region; a projection of the channel region on the base substrate substantially overlaps with that of the etch stop layer; a projection of the first node contact region and the second node contact region on the base substrate are outside that of the etch stop layer;
the first node is on a side of the first node contact region away from the base substrate; and the second node is on a side of the second node contact region away from the base substrate;
an orthographic projection of at least a first portion of the first electrode on the base substrate overlaps with an orthographic projection of the second electrode on the base substrate; and
the active layer and at least the first portion of the first electrode are in a same layer, and are made of a semiconductor material comprising $M1O_aN_b$, wherein M1 is a single metal or a combination of metals, $a>0$, and $b \geq 0$;
wherein the second electrode is on a side of the first electrode closer to the base substrate.

3. The array substrate of claim 2, further comprises an auxiliary etch stop layer on a side of the first electrode away from the base substrate; the auxiliary etch stop layer and the etch stop layer are in a same layer and are made of a same material.

4. The array substrate of claim 2, wherein the $M1O_aN_b$ is one of indium gallium zinc oxide, indium zinc hafnium, indium zinc zirconium oxide, indium zinc tin oxide, indium zinc oxide, aluminum indium zinc oxide, zinc oxide, and aluminum indium zinc oxide.

5. A display apparatus, comprising the array substrate of claim 2.

6. An array substrate, comprising:
a base substrate;
a first electrode and a second electrode, the first electrode and the second electrode being two different electrodes selected from a pixel electrode and a common electrode; and
a thin film transistor comprising an active layer, an etch stop layer on a side of the active layer away from the base substrate, a first node, and a second node;
wherein the active layer comprises a channel region, a first node contact region, and a second node contact region; a projection of the channel region on the base substrate substantially overlaps with that of the etch stop layer; a projection of the first node contact region and the second node contact region on the base substrate are outside that of the etch stop layer; the first node is on a side of the first node contact region away from the base substrate; and the second node is on a side of the second node contact region away from the base substrate;

an orthographic projection of at least a first portion of the first electrode on the base substrate overlaps with an orthographic projection of the second electrode on the base substrate; and the active layer and at least the first portion of the first electrode are in a same layer, and are made of a semiconductor material comprising $M1O_aN_b$, wherein M1 is a single metal or a combination of metals, a>0, and b≥0;

wherein the first electrode is the pixel electrode and the second electrode is the common electrode;

wherein the thin film transistor further comprises a gate electrode on the base substrate;

wherein the array substrate further comprises:

a common electrode signal line in a same layer as the gate electrode; and a gate insulating layer between the gate electrode and the active layer;

wherein the common electrode is electrically connected to the common electrode signal line;

wherein the common electrode is on a side of the gate insulating layer closer to the base substrate or on a side of a passivation layer away from the gate insulating layer.

7. The array substrate of claim 6, wherein the second electrode is on a side of the first electrode away from the base substrate.

8. The array substrate of claim 6, wherein the passivation layer is on a side of the gate insulating layer away from the common electrode signal line; and the array substrate comprises a via extending through the gate insulating layer and the passivation layer;

wherein the common electrode is electrically connected to the common electrode signal line through the via.

9. An array substrate, comprising:

a base substrate;

a first electrode and a second electrode, the first electrode and the second electrode being two different electrodes selected from a pixel electrode and a common electrode; and a thin film transistor comprising an active layer, an etch stop layer on a side of the active layer away from the base substrate, a first node, and a second node;

wherein the active layer comprises a channel region, a first node contact region, and a second node contact region; a projection of the channel region on the base substrate substantially overlaps with that of the etch stop layer; a projection of the first node contact region and the second node contact region on the base substrate are outside that of the etch stop layer; the first node is on a side of the first node contact region away from the base substrate; and the second node is on a side of the second node contact region away from the base substrate;

an orthographic projection of at least a first portion of the first electrode on the base substrate overlaps with an orthographic projection of the second electrode on the base substrate; and the active layer and at least the first portion of the first electrode are in a same layer, and are made of a semiconductor material comprising $M1O_aN_b$, wherein M1 is a single metal or a combination of metals, a>0, and b≥0;

wherein the first electrode is the common electrode and the second electrode is the pixel electrode.

10. The array substrate of claim 9, further comprising:

a gate electrode on the base substrate;

a gate insulating layer between the gate electrode and the active layer; and a via extending through the gate insulating layer;

wherein the pixel electrode is on a side of the gate insulating layer closer to the base substrate, and is electrically connected to the second node through the via.

11. The array substrate of claim 9, wherein the second electrode is on a side of the first electrode away from the base substrate.

12. The array substrate of claim 9, further comprises an auxiliary etch stop layer on a side of the first electrode away from the base substrate; the auxiliary etch stop layer and the etch stop layer are in a same layer and are made of a same material.

13. The array substrate of claim 9, wherein the $M1O_aN_b$ is one of indium gallium zinc oxide, indium zinc hafnium, indium zinc zirconium oxide, indium zinc tin oxide, indium zinc oxide, aluminum indium zinc oxide, zinc oxide, and aluminum indium zinc oxide.

14. A display apparatus, comprising the array substrate of claim 9.

15. A method of fabricating an array substrate, comprising:

forming a first electrode and a second electrode on a base substrate, the first electrode and the second electrode being two different electrodes selected from a pixel electrode and a common electrode, wherein the second electrode is formed on a side of the first electrode closer to the base substrate; and forming a thin film transistor comprising an active layer, an etch stop layer on a side of the active layer away from the base substrate, a first node, and a second node;

wherein the active layer is formed to have a channel region, a first node contact region, and a second node contact region; a projection of the channel region on the base substrate substantially overlaps with that of the etch stop layer; a projection of the first node contact region and the second node contact region on the base substrate are outside that of the etch stop layer; the first node is formed on a side of the first node contact region away from the base substrate; and the second node is formed on a side of the second node contact region away from the base substrate;

the first electrode and the second electrode are formed so that an orthographic projection of at least a first portion of the first electrode on the base substrate overlaps with an orthographic projection of the second electrode on the base substrate; and the active layer and at least the first portion of the first electrode are formed in a same layer, and are formed using a semiconductor material comprising $M1O_aN_b$, wherein M1 is a single metal or a combination of metals, a>0, and b≥0.

16. The method of claim 15, further comprising forming an auxiliary etch stop layer on a side of the first electrode away from the base substrate; the auxiliary etch stop layer and the etch stop layer are formed in a same layer and are made of a same material.

17. The method of claim 15, further comprising forming a data line,
wherein the step of forming the data line comprises forming a first sub-layer and forming a second sub-layer; the first sub-layer is formed on a side of the second sub-layer closer to the base substrate;
the first sub-layer is formed in a same layer as the active layer and the first electrode, and is formed using a same material as that of the active layer and the first electrode; and
the second sub-layer is formed in a same layer as the first node and the second node, and is formed using a same material as that of the first node and the second node.

18. The method of claim 15, wherein the first electrode is the pixel electrode and the second electrode is the common electrode, the method comprising:
forming a gate electrode and a common electrode signal line on the base substrate;
forming a gate insulating layer on a side of the gate electrode and the common electrode signal line away from the base substrate;
forming a semiconductor material layer on a side of the gate insulating layer away from the gate electrode and the common electrode signal line; the semiconductor material comprising $M1O_aN_b$, wherein M1 is a single metal or a combination of metals, a>0, and b≥0;
forming an etch stop material layer on a side of the semiconductor material layer away from the gate insulating layer;
patterning the etch stop material layer using a mask plate thereby forming the etch stop layer and an auxiliary etch stop layer;
forming an electrode material layer on a side of the etch stop layer and the auxiliary etch stop layer away from the semiconductor material layer;
patterning the electrode material layer and the semiconductor material layer using a single mask plate, thereby forming the first node, the second node, the active layer, the first electrode, and the data line comprising a first sub-layer and a second sub-layer;
forming a passivation layer on a side of the first node, the second node, and the data line away from the gate insulating layer;
forming a via extending through the passivation layer and the gate insulating layer; and
forming a second electrode on a side of the passivation layer away from the gate insulating layer;
wherein the second electrode is formed to be electrically connected to the common electrode signal line through the via; the step of patterning the electrode material layer and the semiconductor material layer comprises etching the electrode material layer and the semiconductor material layer using a same etchant.

19. The method of claim 15, wherein the first electrode is the pixel electrode and the second electrode is the common electrode, the method comprising:
forming a gate electrode, a common electrode signal line, and the second electrode on the base substrate; the second electrode being formed to be electrically connected to the common electrode signal line;
forming a gate insulating layer on a side of the gate electrode, the common electrode signal line, and the second electrode away from the base substrate;
forming a semiconductor material layer on a side of the gate insulating layer away from the gate electrode, the common electrode signal line, and the second electrode; the semiconductor material comprising $M1O_aN_b$, wherein M1 is a single metal or a combination of metals, a>0, and b≥0;
forming an etch stop material layer on a side of the semiconductor material layer away from the gate insulating layer;
patterning the etch stop material layer using a mask plate thereby forming the etch stop layer and an auxiliary etch stop layer;
forming an electrode material layer on a side of the etch stop layer and the auxiliary etch stop layer away from the semiconductor material layer;
patterning the electrode material layer and the semiconductor material layer using a single mask plate, thereby forming the first node, the second node, the active layer, the first electrode, and the data line comprising a first sub-layer and a second sub-layer; and
forming a passivation layer on a side of the first node, the second node, and the data line away from the gate insulating layer;
wherein the step of patterning the electrode material layer and the semiconductor material layer comprises etching the electrode material layer and the semiconductor material layer using a same etchant.

20. The method of claim 15, wherein the first electrode is the common electrode and the second electrode is the pixel electrode, the method comprising:
forming a gate electrode, a common electrode signal line, and the second electrode on the base substrate;
forming a gate insulating layer on a side of the gate electrode, the common electrode signal line, and the second electrode away from the base substrate;
forming a first via and a second via extending through the gate insulating layer;
forming a semiconductor material layer on a side of the gate insulating layer away from the gate electrode, the common electrode signal line, and the second electrode;
forming an etch stop material layer on a side of the semiconductor material layer away from the gate insulating layer;
patterning the etch stop material layer using a mask plate thereby forming the etch stop layer and an auxiliary etch stop layer;
forming an electrode material layer on a side of the etch stop layer and the auxiliary etch stop layer away from the semiconductor material layer;
patterning the electrode material layer and the semiconductor material layer using a single mask plate, thereby forming the first node, the second node, the active layer, the first electrode, and the data line comprising a first sub-layer and a second sub-layer; the first electrode electrically connected to the common electrode signal line through the first via, the second node electrically connected to the second electrode through the second via; and
forming a passivation layer on a side of the first node, the second node, and the data line away from the gate insulating layer;

wherein the step of patterning the electrode material layer and the semiconductor material layer comprises etching the electrode material layer and the semiconductor material layer using a same etchant.

* * * * *